(12) United States Patent
Gronlund

(10) Patent No.: US 7,869,238 B2
(45) Date of Patent: Jan. 11, 2011

(54) N-WAY MODE CONTENT ADDRESSABLE MEMORY ARRAY

(75) Inventor: Christopher Gronlund, Kent, WA (US)

(73) Assignee: Broadcom Corporation, Irvine, CA (US)

( * ) Notice: Subject to any disclaimer, the term of this patent is extended or adjusted under 35 U.S.C. 154(b) by 204 days.

(21) Appl. No.: 12/151,893

(22) Filed: May 10, 2008

(65) Prior Publication Data
US 2009/0279340 A1 Nov. 12, 2009

(51) Int. Cl.
G11C 15/00 (2006.01)
(52) U.S. Cl. ............... 365/49.16; 365/49.1; 365/49.17
(58) Field of Classification Search ............... 365/49.1, 365/49.16, 49.17, 189.06, 189.07
See application file for complete search history.

(56) References Cited

U.S. PATENT DOCUMENTS

| | | | | |
|---|---|---|---|---|
| 6,771,525 B2 * | 8/2004 | Roth | ............... | 365/49.15 |
| 7,466,576 B2 * | 12/2008 | Narayanaswamy et al. | ...... | 365/49.18 |
| 7,495,977 B1 * | 2/2009 | Moscaluk | ............... | 365/200 |

* cited by examiner

*Primary Examiner*—Richard Elms
*Assistant Examiner*—Hien N Nguyen
(74) *Attorney, Agent, or Firm*—Farjami & Farjami LLP

(57) ABSTRACT

An N-way mode CAM (content addressable memory) array includes M rows that each contain N subwords. Each of the N subwords has a respective mode cell. Additionally, a mode input bus is coupled to each mode cell of each of the N subwords, and a data input bus is coupled to each of the M rows. The mode input bus and the data input bus can uniquely identify as a match a single subword or a plurality of subwords in one of the M rows during a search operation. The N-way mode CAM further includes a row address encoder/generator coupled to each of the M rows, and an address output bus coupled to each of the row address encoder/generators. The mode input bus is also coupled to each of the row address encoder/generators. A uniquely identified single subword address may be outputted on the address output bus.

18 Claims, 2 Drawing Sheets

N-WAY MODE CONTENT ADDRESSABLE MEMORY ARRAY

BACKGROUND OF THE INVENTION

1. Field of the Invention

The present invention is generally in the field of memory arrays. More particularly, the present invention relates to content addressable memory arrays.

2. Background Art

Conventional CAM (content addressable memory) arrays are typically used in applications requiring high search speeds. A conventional CAM array achieves high search speed by comparing input data to the entire CAM array quickly, for example in one hardware operation, and outputting the address where data uniquely identified by the input data is stored, i.e. outputting the address of a memory location in the CAM array containing data identical to the input data. The conventional CAM array thus accomplishes a search more quickly than, for example, a conventional non-CAM array that must be searched sequentially by an external device or program.

Conventional CAM arrays, while useful in high-speed search applications, have several drawbacks. For example, conventional CAM arrays are more expensive to fabricate than conventional non-CAM arrays, in part because additional circuitry is required for performing searches in hardware. Additionally, conventional CAM arrays are inflexible unless masking techniques are utilized. For example, a conventional CAM array fabricated with 32-bit words is operable as, for example, a 16-bit word CAM array only by masking the unused bits via an external device or program. Such masking is wasteful in terms of, for example, the time needed to perform masking operations and the space unused in the conventional CAM array.

Thus, there is a need in the art for a CAM array that overcomes disadvantages of conventional CAM arrays.

SUMMARY OF THE INVENTION

An N-way mode CAM (content addressable memory) array, substantially as shown in and/or described in connection with at least one of the figures, and as set forth more completely in the claims.

DETAILED DESCRIPTION OF THE INVENTION

The present invention is directed to an N-way mode CAM (content addressable memory) array. Although the invention is described with respect to specific embodiments, the principles of the invention, as defined by the claims appended herein, can obviously be applied beyond the specific embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
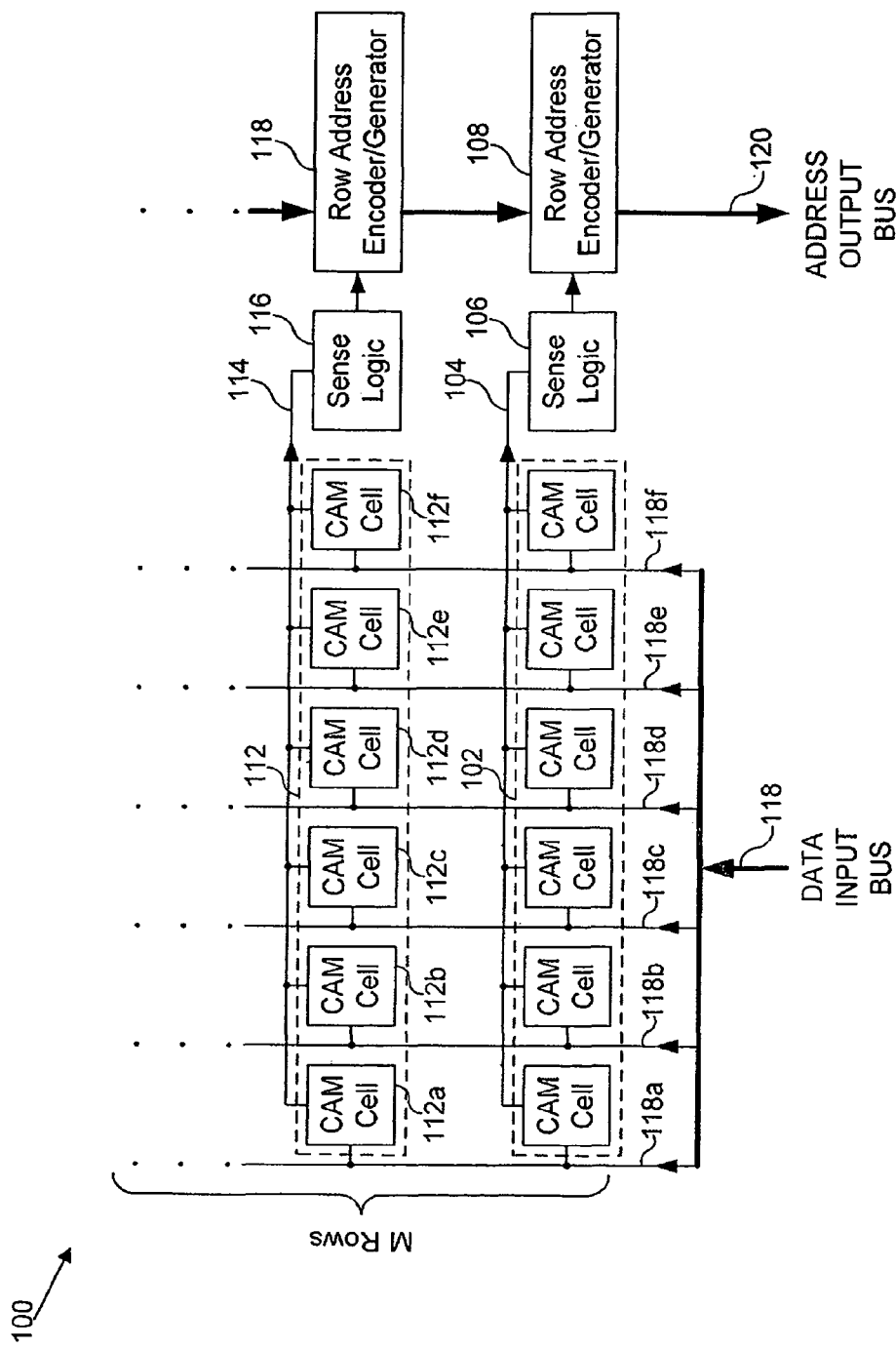
FIG. 1 shows an example of a conventional CAM (content addressable memory) array.

A conventional CAM (content addressable memory) 100 is shown in FIG. 1. CAM array 100 includes M rows, each comprising a CAM word, a sense logic, and a row address encoder/generator. For example, a first row comprises CAM word 102, sense logic 106, and row address encoder/generator 108, while a second row comprises CAM word 112, sense logic 116, and row address encoder/generator 118. During a write operation, data is written to one or more CAM words, and during a search operation, CAM array 100 compares the data on data input bus 118 with data stored in the CAM words of CAM array 100 and outputs data on address output bus 120, as described below.

In the present example, each CAM word comprises six CAM cells; for example, CAM word 112 comprises CAM cells 112$a$, 112$b$, 112$c$, 112$d$, 112$e$, and 112$f$ ("CAM cells 112$a$ through 112$f$"). Each CAM cell can store one bit of data. The CAM cells in each CAM word are coupled to lines in data input bus 118, which in the present example is six bits wide. For example, CAM cells 112$a$ through 112$f$ are coupled to lines 118$a$, 118$b$, 118$c$, 118$d$, 118$e$, and 118$f$ ("lines 118$a$ through 118$f$"), as shown in FIG. 1. The CAM cells in each CAM word are additionally coupled to a common match line. For example, CAM cells 112$a$ through 112$f$ of CAM word 112 are coupled to match line 114, while the CAM cells of CAM word 102 are coupled to match line 104. Match lines 114 and 104 are coupled to sense logics 116 and 106, which are in turn coupled to row address encoder/generators 118 and 108, respectively.

During a search operation, conventional CAM array 100 compares the data on data input bus 118 to the data stored in each CAM word of CAM array 100, and outputs the address of the CAM word uniquely identified by the data on data input bus 118, i.e. the CAM word storing data identical to the data on data input bus 118, on address output bus 120. In the present example, if more than one CAM word have stored data identified by data input bus 118, then CAM array 100 outputs the lowest matching address, but other examples of conventional CAMs may follow a different policy (e.g., outputting the highest matching address). Additionally, the present example utilizes binary logic circuits, such that data input bus 118 may uniquely identify a CAM word if and only if an exact binary match is found. Other conventional CAMs may instead use, for example, ternary logic, allowing for partial binary matches.

Conventional CAM array 100 compares the data on data input bus 118 to data stored in a CAM word by comparing the bits on lines 118$a$ through 118$f$ to the bit stored in each respective CAM cell. For example, data input bus 118 uniquely identifies CAM word 112 if the bits on lines 118$a$ through 118$f$ match the bits stored in CAM cells 112$a$ through 112$f$. In one embodiment, prior to making this bitwise comparison, sense logic 116 precharges match line 114, and each of CAM cells 112$a$ through 112$f$ may subsequently discharge match line 114 if the CAM cell stores a bit different than the bit on the respective line. If no CAM cell discharges match line 114, sense logic 116 indicates a match to row address encoder/generator 118. The other M-1 CAM words of CAM array 100, including CAM word 102, simultaneously also compare stored data with data input bus 118, and indicate matches via M-1 respective sense logics to M-1 respective row address encoder/generators.

In the present example, after all matches (also referred to as "unique identification" of words or subwords in the present application), if any exist, are indicated by the sense logics to the row address encoder/generators of CAM array 100, the row address encoder/generators output the lowest matching address on address output bus 120. In one embodiment, the lowest matching address is determined by passing a matching address down through all lower non-matching row address encoder/generators, until the matching address is replaced by a lower matching address, and outputted on address output bus 120. In the present example, if sense logic 106 indicates a match to row address encoder/generator 108, row address encoder/generator 108 outputs the lowest address, e.g. address 1, on address output bus 120. Otherwise, row address encoder/generator 108 outputs the address passed down by row address encoder/generator 118, which will either be address 2, if sense logic 116 indicates a match to row address encoder/generator 118, or an address between 3 and M passed down from a higher row address encoder/generator.

Thus, conventional CAM array 100 can perform a search operation quickly by simultaneously comparing the data stored in each CAM word to the data on data input bus 118 to uniquely identify one or more CAM words, and quickly output the lowest matching address on address output bus 120, as described above. CAM array 100 can thus be used in applications requiring high search speeds. However, CAM array 100 is inflexible, insofar as CAM array 100 has been fabricated with a fixed word length, for example with 6-bit CAM words. Conventional CAM array 100 is operable as, for example, a CAM with 3-bit CAM words, but only by masking the unused 3 bits per CAM word via an external device or program. Such masking is wasteful in terms of, for example, the time needed to perform masking operations and the space unused in CAM array 100. The latter factor is particularly important given the increased cost of fabricating conventional CAMs in comparison to fabricating conventional ordinary memory arrays.

Figure 2:
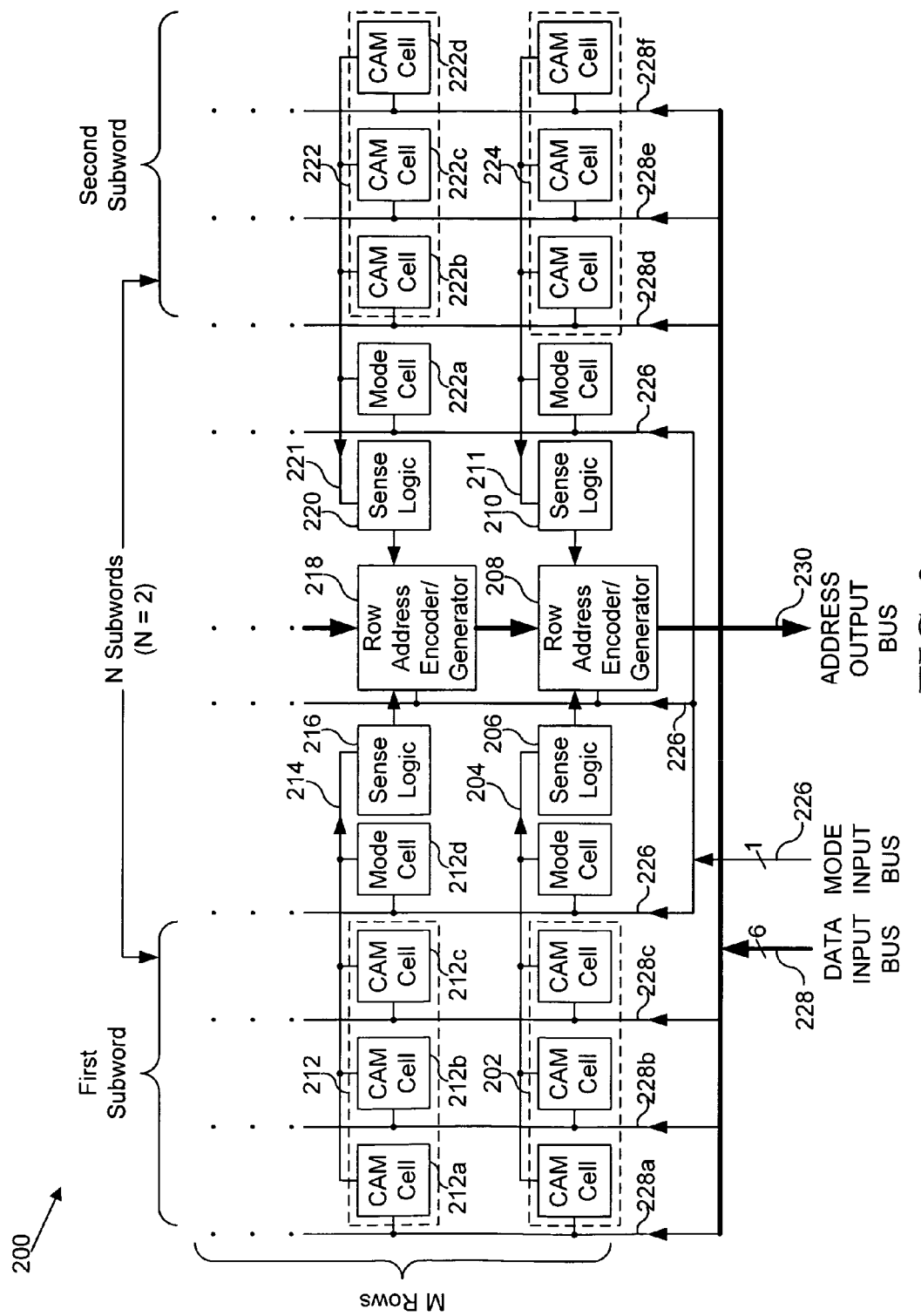
FIG. 2 shows an exemplary N-way mode CAM array, according to one embodiment of the present invention.

A 2-way mode CAM (content addressable memory) array, according to one embodiment of the present invention, is shown in FIG. 2 as CAM array 200. 2-way mode CAM array 200 is a simpler example of an N-way mode CAM array according to the present invention, where N, generally an integer, is equal to 2. A 2-way CAM array is used herein to describe the novel concepts of the present invention in order to preserve brevity and for ease of discussion. However, it is understood by those of ordinary skill in the art that the novel concepts explained in relation to the 2-way mode CAM array described below with respect to the present exemplary embodiment can be easily extended and applied to an N-way mode CAM array, where N can be an integer greater than 2.

In the present example, CAM array 200 includes M rows, each comprising CAM first and second subwords having respective mode cells, a pair of sense logics, and a row address encoder/generator. For example, a first row comprises CAM first and second subwords 202 and 224 and respective mode cells, sense logics 206 and 210, and row address encoder/generator 208, while a second row comprises CAM first and second subwords 212 and 222, respective mode cells 212d and 222a, sense logics 216 and 220, and row address encoder/generator 218. During a write operation, data is written to one or more CAM subwords and respective mode cells. During a search operation in 1-way or 2-way mode, the address of one or more CAM subwords is outputted on address output bus 230, as described below.

In the present embodiment, each CAM subword comprises three CAM cells. For example, CAM first subword 212 comprises CAM cells 212a, 212b, and 212c, and CAM second subword 222 comprises CAM cells 222b, 222c, and 222d. Each CAM subword has an respective mode cell. For example, CAM first subword 212 has mode cell 212d, and CAM second subword 222 has mode cell 222a. Each CAM cell and each mode cell can store a one-bit logical value. While each CAM or mode cell in the present embodiment of the invention utilizes binary logic, such that only exact binary matches can be indicated during a search operation, other embodiments may instead use, for example, ternary logic, allowing for partial binary matches.

The CAM cells in each CAM subword are coupled to lines in data input bus 228, which in the present example is six bit lines wide. For example, CAM cells 212a, 212b, and 212c are coupled to lines 228a, 228b, and 228c, while CAM cells 222b, 222c, and 222d are coupled to lines 228d, 228e, and 228f, as shown in FIG. 2. Additionally, the mode cells associated with each CAM subword are coupled to lines in mode input bus 226. For example, mode cells 212d and 222a are coupled to mode input bus 226. In the present embodiment, mode input bus 226 is 1 bit wide, because 1 bit is sufficient to distinguish between the 1-way and 2-way modes of CAM array 200. In embodiments of the present invention having more than two modes, such as 3-way or 4-way mode CAM arrays, the mode input bus will be wider to accommodate the extra modes. For example, in a 4-way mode CAM array according to the present invention, the mode input bus will be 2 bits wide.

The CAM cells and respective mode cell of each CAM subword are coupled to a common match line. For example, CAM cells 212a, 212b, and 212c and mode cell 212d are coupled to match line 214, while CAM cells 222b, 222c, and 222d and mode cell 222a are coupled to match line 221. Additionally, the CAM cells and respective mode cell of CAM first subword 202 are coupled to match line 204, while the CAM cells and respective mode cell of CAM second subword 224 are coupled to match line 211. Match lines 214 and 221 are coupled to sense logics 216 and 220, which are in turn coupled to row address encoder/generator 218. Match lines 204 and 211 are coupled to sense logics 206 and 210, which are in turn coupled to row address encoder/generator 208.

During a search operation in either 1-way or 2-way mode, CAM array 200 compares the data on data input bus 228 and mode input bus 226 to data stored in one or more CAM subwords and respective mode cells by comparing the bits on the lines of data input bus 228 and mode input bus 226 to the bits stored in each coupled CAM cell and mode cell. CAM array 200 may thereby determine if data input bus 228 and mode input bus 226 uniquely identify a single CAM subword or a plurality of CAM subwords. For example, data input bus 228 uniquely identifies CAM first subword 212 if the bits on lines 228a, 228b, and 228c match the bits stored in CAM cells 212a, 212b, and 212c, and the bit on mode input bus 226 matches the bit stored in mode cell 212d. CAM second subword 222 and respective mode cell 222a can similarly be compared to lines 228d, 228e, and 228f of data input bus 228 and mode input bus 226.

In one exemplary embodiment, during the search operation in either 1-way or 2-way mode, prior to making the bitwise comparison described above, the sense logics of CAM array 200 precharge the match lines. For example, sense logic 216 precharges match line 214. Subsequently, one or more CAM cells 212a, 212b, and 212c or mode cell 212d may discharge match line 214 if the CAM cell or mode cell stores a bit different than the bit on the respective data input bus line or on mode input bus 226. If no CAM cell or mode cell discharges match line 214, sense logic 216 indicates a match to row address encoder/generator 218. Simultaneously, CAM second subword 222 and the other 2*(M−1) CAM subwords (not shown in FIG. 2) also indicate matches, if any, via sense logics to respective row address encoder/generators.

During a search operation, the 1-way mode operation and 2-way mode operation are distinguished and selected by the value of mode input bus 226. In one embodiment of the invention, if mode input bus 226 is a logical 0, CAM array 200 will perform a search operation in the 1-way mode, and if mode input bus 226 is a logical 1, CAM array 200 will perform a search operation in the 2-way mode. In the 1-way mode, CAM array 200 emulates a 6-bit word CAM array having M CAM words, by treating pairs of 3-bit CAM first and second subwords as single 6-bit CAM words. In the 2-way mode, CAM array 200 emulates a 3-bit word CAM array having 2*M 3-bit words, by treating CAM first and second subwords individually. These emulations are achieved, in part, by coupling mode input bus 226 to each row address encoder/generator in CAM array 200, as shown in FIG. 2. In the 1-way mode, each row address encoder/generator will output a matching address on address output bus 230 if and only if a match is indicated by both coupled sense logics, whereas in the 2-way mode, each row address encoder/generator may output a matching address if either coupled sense logic indicates a match, as described below.

If the 1-way mode is selected during a search operation, every mode cell in CAM array 200 is compared with a logical 0 value on mode input bus 226, and only CAM first and second subwords associated with mode cells storing a logical 0 can potentially be uniquely identified as a match. For example, in the 1-way mode, CAM first subword 212 will not indicate a match via sense logic 216 if respective mode cell 212d stores a logical 1, regardless of whether CAM cells 212a, 212b, and 212c match the data on data input bus 228. Similarly, in the 1-way mode, CAM second subword 222 will not indicate a match via sense logic 220 if respective mode cell 222a stores a logical 1, regardless of whether CAM cells 222b, 222c, and 222d match the data on data input bus 228. Notably, because in the 1-way mode CAM array 200 is emulating a 6-bit word CAM array, both CAM first and second subwords 212 and 222 must indicate matches via sense logics 216 and 220 to row address encoder/generator 218 before row address encoder/generator 218 outputs an address on address output bus 230. If two matches are not so indicated, then either mode cells 212d and 222a were not configured for the 1-way search (i.e., one or both stored logical 1), or mode cells 212d and 222a were configured for the 1-way search, but CAM first and second subwords 212 and 222 stored a 6-bit value not uniquely identified by (i.e. not exactly matched with) the data on data input bus 228.

If the 2-way mode is selected during a search operation, every mode cell in CAM array 200 is compared with a logical 1 value on mode input bus 226, and only CAM first or second subwords associated with a mode cell storing a logical 1 can potentially be uniquely identified as a match. For example, the in 2-way mode, CAM first subword 212 will indicate a match via sense logic 216 if respective mode cell 212d stores a logical 1 and CAM cells 212a, 212b, and 212c are uniquely identified by data input bus 228. In contrast with the 1-way mode, in which CAM array 200 emulates a 6-bit word CAM array, in the 2-way mode CAM array 200 emulates a 3-bit word CAM array. Therefore, either CAM first or second subword 212 or 222 may indicate a match via sense logic 216 or 221 to row address encoder/generator 218 to prompt row address encoder/generator 218 to output an address on address output bus 230.

During a search operation in either the 1-way or 2-way mode, after all matches (also referred to as "unique identification" of words or subwords in the present application), if any exist, are indicated to the row address encoder/generators of CAM array 200, the row address encoder/generators output the lowest matching address on address output bus 230. The lowest matching address is determined by passing a matching address down through all lower non-matching row address encoder/generators, until the matching address is replaced by a lower matching address, and outputted on address output bus 230. In the present example, in the 1-way mode, if sense logics 206 and 210 indicate a match to row address encoder/generator 208, row address encoder/generator 208 outputs the lowest address, i.e. address 1, on address output bus 230. Otherwise, row address encoder/generator 208 outputs the address passed down by row address encoder/generator 218, which will either be address 2, if sense logics 216 and 220 indicate a match to row address encoder/generator 118, or an address between 3 and M passed down from a higher row address encoder/generator.

In the present embodiment of the invention, address output bus 230 is wide enough to carry a unique binary address of every CAM subword of CAM array 200, i.e. wide enough to carry 2*M unique addresses in the 2-way mode. In the 1-way mode when CAM array 200 is emulating a 6-bit cam array having M words, one line of address output bus 230 (e.g., the lease significant bit line) will be unused, because there are only M unique binary addresses to encode. In other embodiments, address output bus 230 could be implemented as a narrower bus carrying an encoded address.

In the manner described above, the present example's CAM array 200 can perform search operations quickly by simultaneously comparing the data stored in CAM subwords and respective mode cells to data input bus 228 and mode input bus 226, thereby uniquely identifying and outputting the address of one or more CAM subwords, in either the 1-way or the 2-way mode. The present invention can be similarly extended to make and operate a CAM array in a 1-way, 2-way, 4-way, and/or N-way mode, where N can be any integer greater than 2. The present invention is thus well-suited for applications requiring high search speeds, and also advantageously provides more flexibility than conventional solutions. The increased flexibility avoids the need to utilize wasteful masking techniques and promotes efficient utilization of CAM array circuitry.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. An N-way mode CAM (content addressable memory) array comprising:
   M rows each containing N subwords;
   a mode input bus and a data input bus uniquely identifying a single subword or a plurality of subwords in one of said M rows;
   wherein each of said N subwords in each of said M rows has a respective mode cell, said respective mode cell configured to store a logical value.

2. The N-way mode CAM array of claim 1, wherein said data input bus is coupled to each of said M rows.

3. The N-way mode CAM array of claim 1, wherein said mode input bus is coupled to each said respective mode cell.

4. The N-way mode CAM array of claim 1, further comprising a respective row address encoder/generator coupled to each of said M rows.

5. The N-way mode CAM array of claim 4, wherein said mode input bus is coupled to said respective row address encoder/generator.

6. The N-way mode CAM array of claim 4, further comprising an address output bus coupled to said respective row address encoder/generator.

7. The N-way mode CAM array of claim 1, wherein said mode input bus selects one or more subwords from said N subwords.

8. The N-way mode CAM array of claim 1, wherein at least one of said N subwords in said M rows comprises a binary memory cell.

9. The N-way mode CAM array of claim 1, wherein at least one of said N subwords in said M rows comprises a ternary memory cell.

10. An N-way mode CAM (content addressable memory) array comprising:
   M rows each containing N subwords, each of said N subwords having a respective mode cell, said respective mode cell configured to store a logical value;
   a mode input bus coupled to each mode cell of each of said N subwords;
   a data input bus coupled to each of said M rows, said mode input bus and said data input bus uniquely identifying a single subword or a plurality of subwords in one of said M rows.

11. The N-way mode CAM array of claim 10, further comprising a respective row address encoder/generator coupled to each of said M rows.

12. The N-way mode CAM array of claim 11, wherein said mode input bus is coupled to said respective row address encoder/generator.

13. The N-way mode CAM array of claim 11, further comprising an address output bus coupled to said respective row address encoder/generator.

14. The N-way mode CAM array of claim 10, wherein said mode input bus selects one or more subwords from said N subwords.

15. The N-way mode CAM array of claim 10, wherein at least one of said N subwords in said M rows comprises a binary memory cell.

16. The N-way mode CAM array of claim 10, wherein at least one of said N subwords in said M rows comprises a ternary memory cell.

17. An N-way mode CAM (content addressable memory) array comprising:
   M rows each containing N subwords;
   a mode input bus coupled to each of said M rows;
   a data input bus coupled to each of said M rows, said mode input bus and said data input bus uniquely identifying a single subword or a plurality of subwords in one of said M rows;
   wherein each of said N subwords in each of said M rows has a respective mode cell, said respective mode cell configured to store a logical value.

18. The N-way mode CAM array of claim 17, wherein said mode input bus is coupled to each said respective mode cell.

* * * * *